United States Patent [19]
Chan et al.

[11] Patent Number: 6,104,207
[45] Date of Patent: Aug. 15, 2000

[54] PROGRAMMABLE LOGIC DEVICE

[75] Inventors: Albert Chan, Palo Alto; Ju Shen, San Jose; Cyrus Y. Tsui, Los Altos, all of Calif.

[73] Assignee: Lattice Semiconductor Corporation, Hillsboro, Oreg.

[21] Appl. No.: 09/067,318

[22] Filed: Apr. 27, 1998

[51] Int. Cl.[7] ............................. G06F 7/38; H01L 25/00
[52] U.S. Cl. .............................. 326/40; 326/37; 326/38; 326/39; 326/40; 326/41; 326/47
[58] Field of Search ................................. 326/39, 37, 38, 326/40, 41, 47

[56] References Cited

U.S. PATENT DOCUMENTS

| | | | |
|---|---|---|---|
| 5,350,954 | 9/1994 | Patel | 307/465 |
| 5,414,376 | 5/1995 | Hawes | 326/39 |
| 5,414,377 | 5/1995 | Freidin | 326/41 |
| 5,457,410 | 10/1995 | Ting | 326/41 |
| 5,757,207 | 5/1998 | Lytle et al. | 326/39 |
| 5,764,080 | 6/1998 | Huang et al. | 326/41 |

OTHER PUBLICATIONS

Altera Corporation Data Sheet: "MAX 9000 Programmable Logic Device Family" A–DS–M9000–05.01, Issue Feb. 1998 version. 5.01.

AMD Report: "The MACH 5 Family: Fifth Generation MACH Architecture" Publication No. 20446, Issue Mar. 1996.

Xilinx Report: "XC9500 In–System Programmable CPLD Family" Version 2.1, Issue Jan. 16, 1998.

*Primary Examiner*—Michael Tokar
*Assistant Examiner*—Vibol Tan
*Attorney, Agent, or Firm*—Skjerven, Morrill, MacPherson, Franklin & Friel LLP; Edward C. Kwok; Daniel P. Stewart

[57] ABSTRACT

An improved programmable logic device is disclosed. In one embodiment, the programmable logic device includes a plurality of I/O cells and a plurality of logic block clusters. Each logic block cluster has a set of logic blocks and a cluster routing pool, which provides programmable connections among the logic blocks and the I/O cells. A global routing pool provides programmable connections among the logic block clusters and the I/O cells. Each logic block includes a programmable logic array with a plurality of outputs. A product term sharing array in the logic block has a plurality of bus lines, each of which is coupled to at least one of the outputs of the programmable logic array. The product term sharing array also includes a plurality of output lines, each of which is coupled to a plurality of programmable interconnections that each provide a connection to one of the bus lines. Each output line of the product term sharing array is coupled to the same number of programmable interconnections. The logic block also includes a register coupled to at least one of the output lines of the product term sharing array. The register has a data input terminal and a data output terminal. First and second output multiplexers each have a first input terminal coupled to the data input terminal of the register and a second input terminal coupled to the data output terminal of the register.

51 Claims, 5 Drawing Sheets

6,104,207

PROGRAMMABLE LOGIC DEVICE

TECHNICAL FIELD OF THE INVENTION

The present invention relates to programmable logic circuits, and in particular, relates to the design of an improved field programmable logic device.

BACKGROUND OF THE INVENTION

One type of high density programmable logic devices ("PLDs") is the in-system programmable Large Scale Integration (ispLSI) devices from Lattice Semiconductor Corporation, Hillsboro, Oreg. An ispLSI device is reprogrammable in its application without being removed from the circuit board. Programmable logic devices can also be implemented in both volatile and non-volatile memory technologies (e.g. electrical erasable programmable read-only memory or EEPROM). High density programmable logic devices, such as the ispLSI devices, are often referred to as "complex PLDs." In a complex PLD, programmable logic functions are configured by programming a number of programmable logic blocks, each programmable logic block is typically implemented by an array of logic gates and registers and has a number of input and output signals.

In a complex PLD, increased functionality often results in increased device size, increased power consumption and increased cost. Therefore, previous programmable logic devices have had significant limitations, including a lack of routing symmetry and the absence of power-up state programmability.

SUMMARY OF THE INVENTION

Thus, a need has arisen for a programmable logic device that addresses the disadvantages and deficiencies of the prior art. Accordingly, an improved programmable logic device is disclosed. In one embodiment, the programmable logic device includes a plurality of I/O cells and a plurality of logic block clusters. Each logic block cluster has a set of logic blocks and a cluster routing pool, which provides programmable connections among the logic blocks and the I/O cells. A global routing pool provides programmable connections among the logic block clusters and the I/O cells.

Each logic block includes a programmable logic array with a plurality of outputs. A product term sharing array in the logic block has a plurality of bus lines, each of which is coupled to at least one of the outputs of the programmable logic array. The product term sharing array also includes a plurality of output lines, each of which is coupled to a plurality of programmable interconnections. The programmable interconnections each provide a connection to one of the bus lines. According to one aspect of the present invention, each output line of the product term sharing array is coupled to the same number of programmable interconnections.

The logic block also includes a register coupled to at least one of the output lines of the product term sharing array. The register has a data input terminal and a data output terminal. A first output multiplexer has a first input terminal coupled to the data input terminal of the register and a second input terminal coupled to the data output terminal of the register. A second output multiplexer has a first input terminal coupled to the data input terminal of the register and a second input terminal coupled to the data output terminal of the register.

A technical advantage of the present invention is that two independent output multiplexers are provided for each register and for each set of product term outputs, thus allowing two different output signals to be utilized. Another technical advantage of the present invention is that a universal product term output is provided from each programmable logic array, allowing all registers coupled to the programmable logic array to utilize a single product term clock signal. Yet another technical advantage is that a preprogrammed value may be selected for each register, which will be assumed by the register upon receipt of a global reset signal. Still another technical advantage is that the product term sharing array is symmetrical in nature, thus eliminating the need for routing restrictions near the ends of the product term sharing array.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 4 of the drawings. Like numerals are used for like and corresponding parts of the various drawings.

Figure 1:
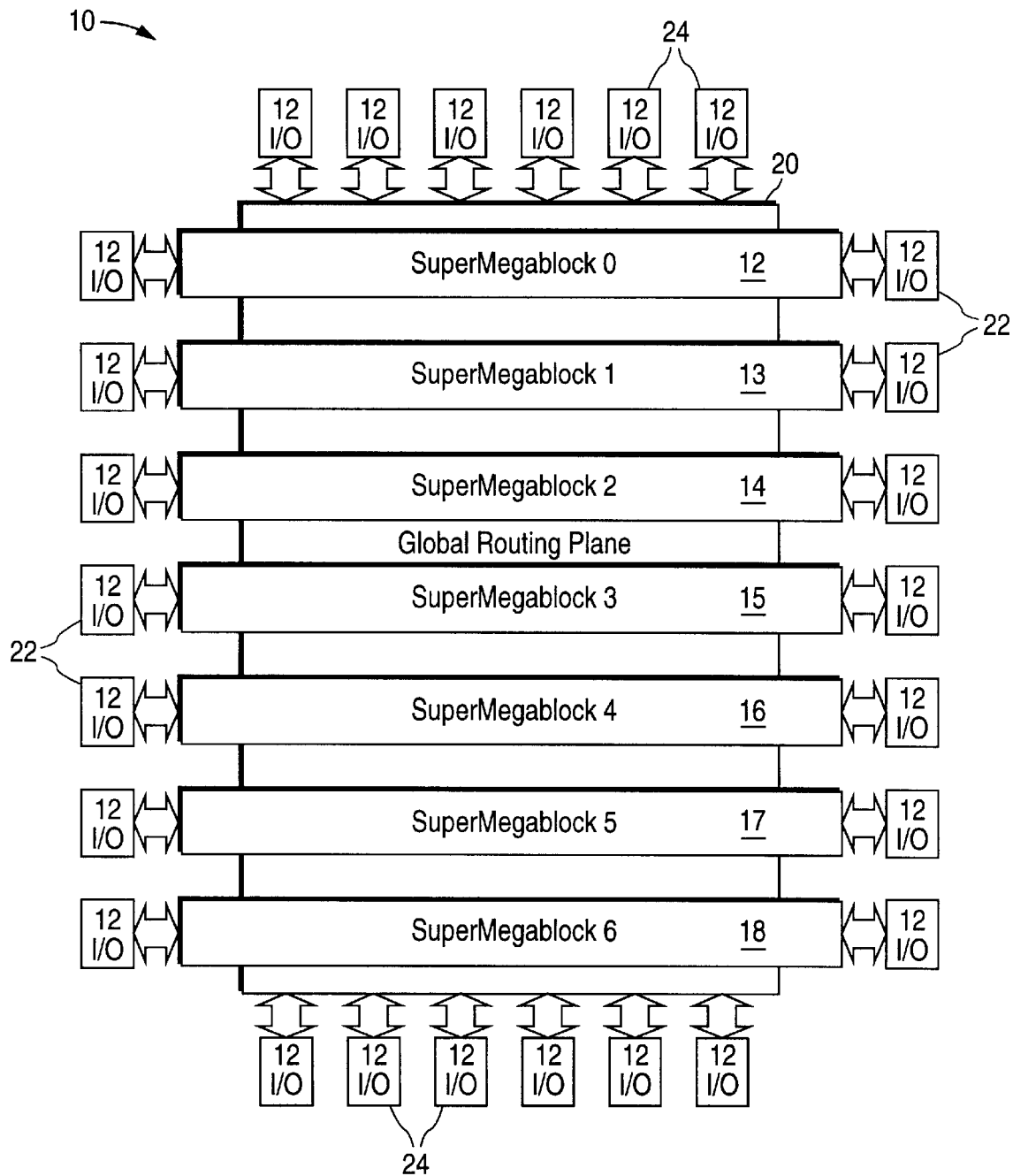
FIGS. 1 and 2 are block diagrams of a programmable logic device constructed in accordance with the present invention.
Figure 2:
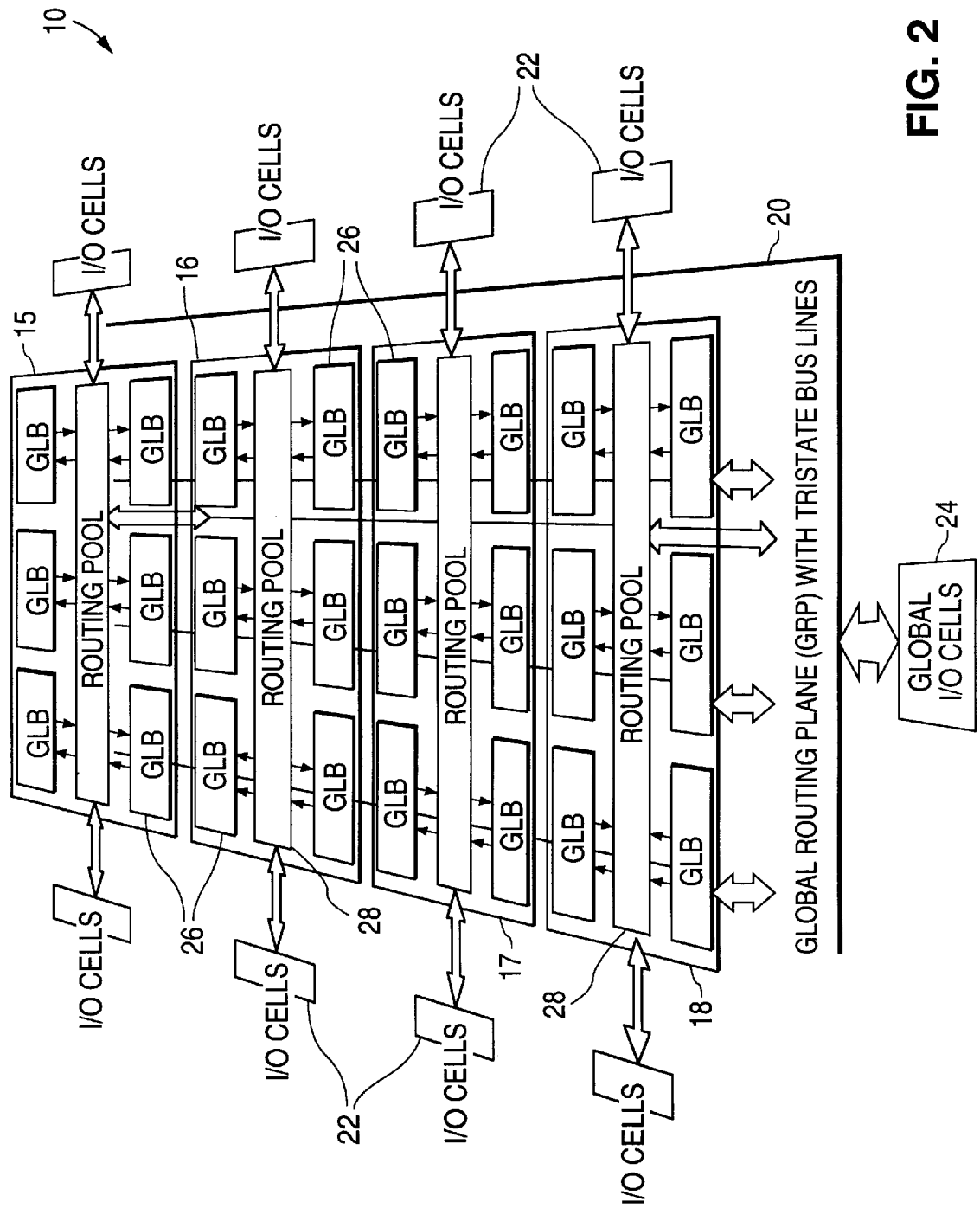

Referring to FIGS. 1 and 2, a programmable logic device 10 constructed in accordance with the present invention is shown. Programmable logic device 10 includes seven logic block clusters 12 through 18. A global routing plane 20 beneath logic block clusters 12 through 18 provides programmable communication lines for communication among logic block clusters 12 through 18.

Logic block clusters 12 through 18 receive input signals and generate output signals via logic block cluster I/0 cells 22. Input and output may also be routed directly from global routing plane 20 through global routing plane I/O cells 24. Programmable logic device 10 also includes an EEPROM cell array (not shown) which is used to provide programmable interconnections and signal routing throughout programmable logic device 10.

Logic block cluster I/O cells 22 and global routing plane I/O cells 24 are coupled to I/O pins (not shown) on programmable logic device 10. The type of I/O pins used for programmable logic device 10 depends on the type of packaging used for programmable logic device 10. For example, in a surface mount package, the I/O pins may be leads extending from a lead frame, while in a ball grid array package, the pins would be solder connections on the bottom surface of the package. In this example, a ball grid array package is used to achieve the desired I/O pin density. Other standard packaging and pinout techniques may also be used.

Programmable logic device 10 may be used to perform logic operations on binary logic input signals to produce output signals. For example, programmable logic device may be programmed to solve the following simple equation:

$$X = A \oplus B \oplus C \oplus A \oplus B \oplus D \oplus D \oplus E$$

In this equation, A, B, C, D and E are input signals received by programmable logic device 10 and X is an output signal produced by programmable logic device 10. The symbol ⊕ denotes an OR operation and ⊙ denotes an AND operation. Thus, "A⊙B⊙C" is a combination of the A, B and C input signals in an AND operation. This type of AND grouping will be referred to herein as a product term.

Referring to FIG. 2, a portion of programmable logic device 10 is shown in greater detail. Each logic block cluster 12 through 18 includes six generic logic blocks 26 which communicate with each other via a cluster routing pool 28. Cluster routing pool 28 also provides a means for the generic logic blocks 26 to communicate with I/O cells 22 and with global routing plane 20.

Generic Logic Block Overview

Referring to FIG. 3, a block diagram of a generic logic block 26 is shown. Generic logic block 26 is, as the name implies, representative of all generic logic blocks 26 in programmable logic device 10. However, for purposes of illustration, generic logic block 26 will be assumed to be a logic block within logic block cluster 18.

Generic logic block 26 has an AND array 30 comprising 82 AND gates with programmable interconnections. AND array 30 receives inputs 32 from AND array input fuse pattern 31. Input fuse pattern 32 establishes programmable interconnections between AND array input lines 32 and lines from cluster routing pool 28. The lines from cluster routing pool 28 may be routed directly from I/O cells 22, or may be routed from another generic logic block, either within or outside logic block cluster 18. Input fuse pattern 32 also establishes programmable interconnections between AND array input lines 32 and fast feedback lines 55, which will be described more fully below.

The programmable interconnections in AND array 30, and throughout programmable logic device 10, may be provided by any known programmable interconnect cell. For example, a "Non-Volatile Erasable and Programmable Interconnect Cell" is disclosed in U.S. Pat. No. 5,251,169, issued to Gregg Josephson on May 6, 1991, which is incorporated herein by reference. Such interconnect cells may be part of the previously discussed EEPROM cell array in programmable logic device 10.

AND array 30 produces product term outputs 34, which are received by macrocells 36. Generic logic block 26 includes 20 macrocells. AND array 30 produces four product term outputs per macrocell, giving 80 product term outputs 34. The product term outputs 34 may be shared by macrocells 36 by means of product term sharing array (PTSA) 38, as will be described more fully below. AND array 30 also produces a universal product term output 40, which will be described in more detail below.

Macrocell Overview

Figure 4:
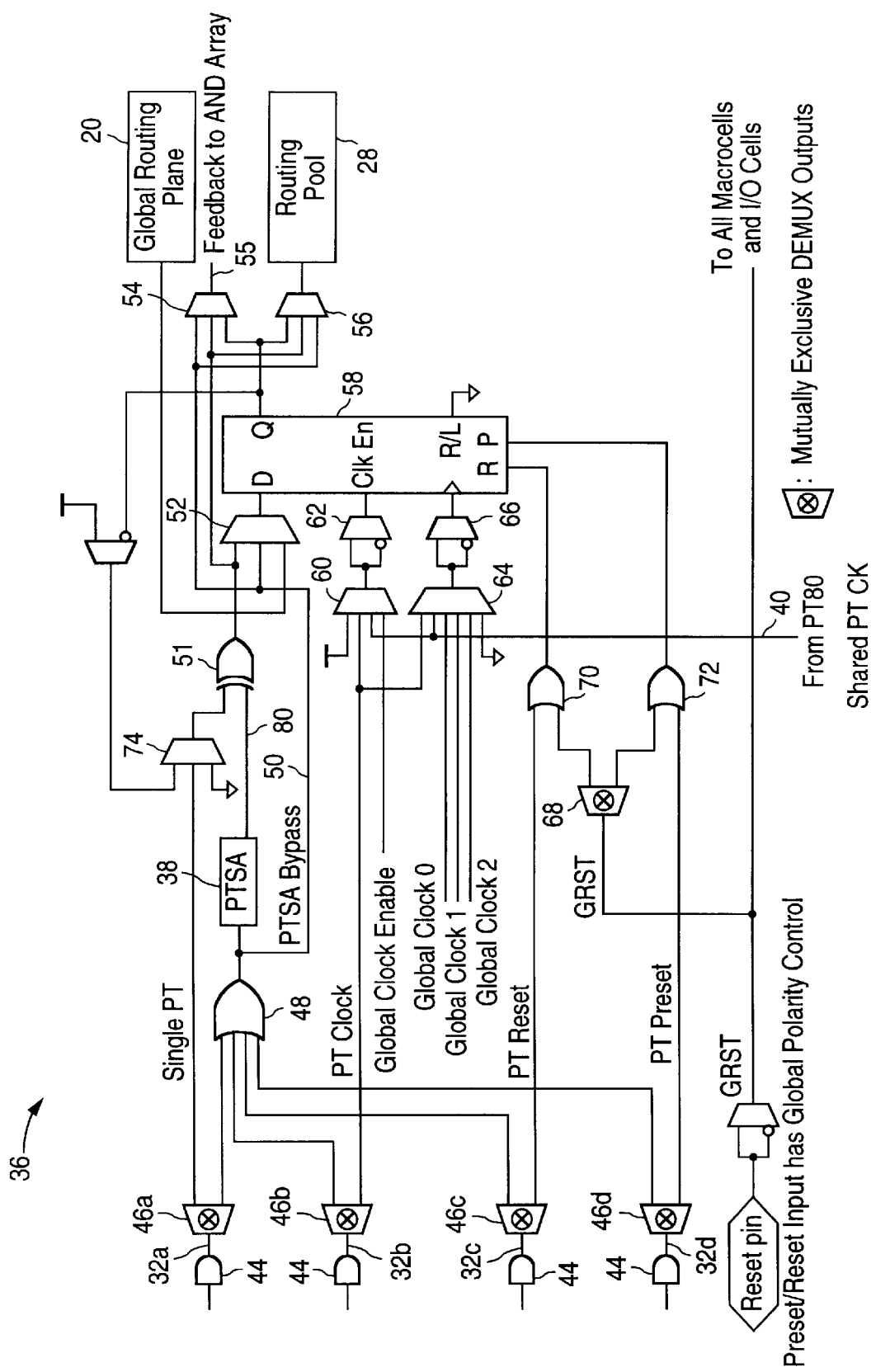
FIG. 4 is a schematic diagram in partial block form of an exemplary macrocell in the programmable logic device.

Referring to FIG. 4, an exemplary macrocell 36 from generic logic block 26 is shown in greater detail. Macrocell 36 receives product term outputs 32a through 32d from AND array 30. Each product term output is driven into macrocell 36 by the product term gate 44, and then routed by a demultiplexer 46a through 46d. One of the outputs from each demultiplexer is connected to the input of a product term summing OR gate 48. The alternative outputs from demultiplexers 46a through 46d will be described below.

Thus, any one or more of the product term outputs 32a through 32d may be routed to product term summing OR gate 48. These product terms are added by OR gate 48. The output of product term summing OR gate 48 is routed to product term sharing array 38, where adjacent macrocells may use the output signal, as will be described more fully below. The output of product term summing OR gate 48 is also routed on a product term sharing array bypass line 50 to a register data multiplexer 52 and two macrocell output multiplexers 54 and 56.

Macrocell Register

A register 58 receives a data input signal (D) from register data multiplexer 52. In this embodiment, register 58 is a rising-edge-triggered D flip-flop. However, register 58 may also be implemented by a falling-edge-triggered flip-flop, or some other type of register. Register data multiplexer 52 selects the source of the data input signal (D) for register 58 according to a select signal received from an EEPROM cell (not shown). The data input signal may come from OR gate 48 via PTSA bypass line 50, as previously discussed.

Alternatively, the data input signal may come from XOR gate 51, the function of which will be described below, or from global routing plane 20. When global routing plane 20 is selected as the data input signal source, register 58 may be used as a status or control register for global routing plane 20. Thus, register 58 may be used to capture the current state of a bus line in global routing plane 20, or to store some other signal in global routing plane 20 from, for example, another macrocell or an I/O cell 22 or 24. In this mode, macrocell 36 can still produce a logic output signal in addition to the register output signal, as will be described more fully below. Because any macrocell register in programmable logic device 10 may be used as a status or control register, the need for additional, dedicated status or control registers in programmable logic device 10 is reduced or eliminated altogether, thereby reducing the cost of programmable logic device 10. Moreover, the signal is received at the data input of register 58 directly from global routing plane 20, without using any of the product term inputs or outputs from AND array 30.

Register 58 receives a clock enable signal (Clk En) via a clock enable multiplexer 60 and a programmable inverter 62. Clock enable multiplexer 60 selects the source of the clock enable signal according to a select signal received from an EEPROM cell (not shown). Programmable inverter 62 selectively inverts the selected clock enable signal according to a select signal received from another EEPROM cell (not shown). Clock enable multiplexer 60 may select a global clock enable signal as the clock enable signal for register 58. Alternatively, clock enable multiplexer 60 may select a constant high signal ($V_{DD}$). Other alternatives for the clock enable signal are a product term clock signal and a universal product term signal, both of which will be described more fully below.

Register 58 receives a clock signal (Clk) via a clock signal multiplexer 64 and a programmable inverter 66. Clock signal multiplexer 64 selects the source of the clock signal according to a select signal received from an EEPROM cell (not shown). Programmable inverter 66 selectively inverts the selected clock signal according to a select signal received from another EEPROM cell (not shown). Clock signal multiplexer 64 may select one of three global clock signals as the clock signal for register 58. Alternatively, clock signal multiplexer 64 may select a constant low signal (ground), effectively disabling register 58. Other alternatives for the clock signal are the product term clock signal and the universal product term signal, both of which will be described more fully below.

Register 58 receives a reset signal (R) and a preset signal (P) which may be used to clear the register. A global reset signal (GRST) is selectively routed to either the reset input or the preset input of register 58 by an exclusive demultiplexer 68. Demultiplexer 68 selects the destination of the global reset signal according to a select signal received from a single EEPROM cell (not shown). By routing the global reset signal to either the reset input or the preset input of register 58, demultiplexer 68 allows register 58 to "reset" to a programmable value when a global reset signal is received, such as when programmable logic device 10 is initially powered up. Thus, a user may program an initial state for all registers in programmable logic device 10, or for some subset of the registers, using only one EEPROM cell per register. This is an advantage over previous programmable logic devices, in which a global reset signal would typically reset (zero) all registers in the device.

Macrocell Input and Control

Demultiplexers 46a through 46d allow each product term output 32a through 32d from AND array 30 to be used within macrocell 36 either as a product term input to product term summing OR gate 48 or as a control signal. Each demultiplexer 46a through 46d receives a select signal from a separate EEPROM cell (not shown).

Thus, for example, product term outputs 32c and 32d may be used as reset and preset inputs, respectively, for register 58. If demultiplexer 46c is programmed to use product term output 32c as a reset signal, then product term output 32c is routed to a reset OR gate 70. Reset OR gate 70 ORs product term output 32c with the reset output from global reset demultiplexer 68. The output from reset OR gate 70 is provided to the reset input (R) of register 58. Thus, either product term output 32c or the global reset signal (GRST) may be used to reset register 58.

Likewise, if demultiplexer 46d is programmed to use product term output 32d as a preset signal, then product term output 32d is routed to a preset OR gate 72. Preset OR gate 72 ORs product term output 32d with the preset output from global reset demultiplexer 68. The output from preset OR gate 72 is provided to the preset input (P) of register 58. Thus, either product term output 32d or the global reset signal may be used to preset register 58.

Demultiplexer 46b may be programmed to use product term output 32b from AND array 30 as a clock signal or clock enable signal for register 58. This is useful when a clock signal or clock enable signal resulting from a logic operation, rather than a standard clock signal or clock enable signal, is required. Thus, demultiplexer 46b may be programmed to route product term output 32b to clock enable multiplexer 60 and clock signal multiplexer 64. Using multiplexers 60 and 64, product term output 32b can be programmed to be either the clock enable signal or the clock signal for register 58.

Product term output 32a, unlike the other product term outputs, may not be used as a control signal for register 58. Instead, product term output 32a may be separately used as a single product term, without being combined with product term outputs 32b, 32c and 32d at OR gate 48. Thus, if demultiplexer 46a is properly programmed, product term output 32a is routed to XOR multiplexer 74. If product term output 32a is selected by XOR multiplexer 74 as the output signal, then the signal is routed to XOR gate 51. There, product term output 32a may be combined with any product terms received from product term sharing array 38, as will be described more fully below. The output of XOR gate 51 may then be selected by register data multiplexer 52 as the data signal for register 58. Alternatively, the output of XOR gate 51 may be selected as an output signal by either macrocell output multiplexer 54 or 56, as will be described more fully below. Thus, the flexibility of macrocell 36 is such that product term output 32a may be stored by register 58 while one or more of the other product term outputs 32b, 32c, 32d bypass register 58 and are produced as an output signal, or vice versa, or both signals may bypass register 58 and be produced as output signals. This output flexibility will be explained more fully below.

Macrocell Output

The output (Q) of register 58 is routed to macrocell output multiplexers 54 and 56. Macrocell output multiplexer 56 provides an output signal to the cluster routing pool 28, where the signal may be programmably routed to I/O cells 22, to another generic logic block 26 within logic block cluster 18, or to global routing plane 20. The output signal from macrocell output multiplexer 56 may be selected from the register output (Q), the PTSA bypass line 50 or XOR gate 51. Macrocell output multiplexer 56 selects the output signal according to a select signal received from an EEPROM cell (not shown).

Macrocell output multiplexer 54 provides an output signal on a fast feedback loop to AND array 30. This output signal is not routed through cluster routing pool 28, and therefore does not experience the line delays associated with that routing. Instead the signal is routed directly back to AND array 30 on a fast feedback line 55, and may therefore be used as a fast feedback signal.

Alternatively, macrocell output multiplexer 54 could provide a second output signal to cluster routing pool 28. Thus, macrocell output multiplexers 54 and 56 could be used to provide two different output signals to cluster routing pool 28.

As with macrocell output multiplexer 56, the output signal from macrocell output multiplexer 54 may be selected from the register output (Q), the PTSA bypass line 50 or XOR gate 51. Macrocell output multiplexer 54 selects the output signal according to a select signal received from an EEPROM cell (not shown).

Macrocell output multiplexers 54 and 56 receive select signals from two separate EEPROM cells. Thus, macrocell output multiplexers 54 and 56 may independently select the sources of their respective output signals. This is an improvement over previous programmable logic devices, in which only a single macrocell output signal was typically available.

As previously described, register 58 may be used as a status or control register for global routing plane 20. In this mode, one of the macrocell output multiplexers 54 or 56 preferably selects the register output (Q) as its output signal, while the other macrocell output multiplexer 54 or 56 selects either the output of XOR gate 51 or product term sharing array bypass line 50 for its output. Thus, in this mode, a logic signal may be produced (but not stored) from product term outputs 32a through 32d, while register 58 is utilized to capture the state of a bus line in global routing plane 20 or some other signal from global routing plane 20.

However, in this mode, it is generally not feasible to produce two separate non-registered logic signals (one from product term output 32a and the other from product term outputs 32b through 32d) within macrocell 36, as can be done in other modes of operation. Thus, register 58 is preferably used as a status or control register only when a single, non-registered logic output from product term outputs 32a through 32d is desired.

Product Term Sharing Array

As previously described, each macrocell 36 has four dedicated product term outputs 32a through 32d from AND array 30. These dedicated product term outputs are available to the macrocell 36 by means of product term sharing array bypass line 50 regardless of the state of product term sharing array 38. However, to enhance the capability and flexibility of programmable logic device 10, product terms may be shared among macrocells by means of product term sharing array 38.

Referring to FIG. 3, product term sharing array 38 includes a set of bus lines 76. The number of bus lines 76 is equal to the number of macrocells 36, for reasons which will become apparent. Thus, in this example, product term sharing array 38 includes 20 bus lines.

In each macrocell 36, a set of four product term outputs 32a through 32d is coupled to a product term summing OR gate 48 as previously described. Each product term summing OR gate 48 has an output connected to a respective one of the bus lines 76. Thus, each bus line 76 in product term sharing array 38 carries an output signal from a respective one of the product term summing OR gates 48.

Product term sharing array 38 also includes 20 output OR gates 78. Each output OR gate 78 produces an output signal on an output line 80, which is connected to an input of XOR gate 51, as shown in FIG. 4.

Each output OR gate 78 receives input signals from selected bus lines 76. A set of programmable interconnections 82 determines which bus lines 76 provide input to each output OR gate 78. Programmable interconnections 82 may be any known type of programmable interconnect cell. Programmable interconnections 82 are available to connect each output OR gate 78 to the product term summing OR gate 48 dedicated to that macrocell 36, as well as product term summing OR gates from adjacent macrocells.

In this example, each output OR gate 78 may be connected to as many as six product term summing OR gates 48 in addition to its own dedicated product term summing OR gate 48. The available product term summing OR gates 48 include the three product term summing OR gates 48 immediately "above" the macrocell and the three product term summing OR gates 48 immediately "below" the macrocell. Thus, each output OR gate 78 may be connected to its own dedicated product term summing OR gate 48 and six adjacent product term summing OR gates.

For the output OR gate 78 located at the top of product term sharing array 38, it will be apparent that there are no product term summing OR gates 48 located "above" the output OR gate 78. Thus, in an asymmetrical product term sharing arrangement, the output OR gate 78 located at the top of product term sharing array 38 would have only four product term summing OR gate 48 outputs available to it: the product term summing OR gate 48 dedicated to that macrocell and the three product term summing OR gates 48 immediately "below" the macrocell. This is in contrast to the output OR gates 78 located near the center of product term sharing array 38, which would each have seven product term summing OR gate 48 outputs available to it.

Likewise, the output OR gate 78 located at the bottom of product term sharing array 38 would have only four product term summing OR gate 48 outputs available to it in an asymmetrical arrangement. This difference in the number of available paths to each output OR gate 78 would create restrictions in the routing of product terms through product term sharing array 38, making programmable logic device 10 less flexible and more cumbersome to program.

However, as illustrated in FIG. 3, the output OR gate 78 located at the top of product term sharing array 38 may be connected to the three bottom-most product term summing OR gates 48 as well as the three product term summing OR gates 48 immediately "below" the output OR gate 78. Likewise, the bottom-most output OR gate 78 in product term sharing array 38 may be connected to the three top-most product term summing OR gates 48 as well as the three product term summing OR gates 48 located immediately "above" the output OR gate 78. As is shown in FIG. 3, similar arrangements are made for the other output OR gates 78 near the top and bottom of product term sharing array 38.

Thus, product term sharing array 38 is said to have "wraparound" or circular symmetry. Each output OR gate 78 has programmable interconnections to seven bus lines 76, and each product term summing OR gate 48 output is made available to seven output OR gates 78, regardless of location within product term sharing array 38.

This is an improvement over previous programmable logic devices, in which product term sharing became asymmetric near the ends of the product term sharing array, thereby placing limitations on routing within the programmable logic device and creating an uneven distribution of product term sharing. Moreover, the symmetrical product term sharing of the present invention is accomplished with only one additional OR gate (output OR gate 78) per output line from product term sharing array 38. Thus, product term sharing array 38 may be expanded in size without significantly increasing the signal delays created by product term sharing array 38.

It should be noted that the number of available connections for each output OR gate 78 could be any number from two to the total number of product term summing OR gates 48, which in this example is 20. In the case of 20 available connections for each output OR gate 78, the output of every product term summing OR gate 48 is made available to each output OR gate 78. This arrangement, known as a "fully populated" product term sharing array, may be feasible for smaller generic logic blocks with fewer product term inputs and fewer product term sharing array outputs. However, with 20 product term sharing array outputs, such an arrangement would be prohibitively large and slow. Thus, a more limited, but still symmetrical, arrangement is preferred in this example.

In accordance with the foregoing, each output OR gate 78 receives output signals from up to seven product term summing OR gates 48. These signals are ORed together at output OR gate 78. The output of output OR gate 78 is received by XOR gate 51. If XOR multiplexer 74 is programmed to select ground as its output, then the output from output OR gate 78 is passed through XOR gate 51 to register data multiplexer 52, where the signal may be selected as the data input signal (D) for register 58. Alternatively, if XOR multiplexer 74 is programmed to select either product term output 32a or the output signal (Q) from register 58, then the selected signal is combined in an exclusive OR operation with the output signal from output OR gate 78 in product term sharing array 38. The resulting output signal is provided to register data multiplexer 52, where the signal may be selected as the data input signal (D) for register 58, and is also provided to macrocell output multiplexers 54 and 56 as previously described.

While product term sharing array 38 has been described herein as receiving product term outputs from AND array 30, product term sharing array 38 may be used to share output values derived from any kind of logic array. Thus, the phrase "product term," as used herein, may be any type of logic output signal.

Furthermore, while product term sharing array 38 is described as allowing product term sharing primarily among adjacent macrocells, product term sharing array 38 may be configured to allow product term sharing according to any desired pattern. For example, product term sharing array 38 could be configured to allow each output OR gate 78 to receive signals from every third or fourth product term summing OR gate 48. The selected product term sharing pattern may or may not involve an even distribution of shared product terms throughout product term sharing array 38, as described above.

Universal Product Term Clock

As previously stated, it is sometimes desirable for a macrocell to utilize a clock signal resulting from a logic operation, rather than an oscillator output. Furthermore, in a generic logic block 26 of programmable logic device 10, it may be desirable for some or all macrocells 36 within the generic logic block to use the same clock signal resulting from a logic operation.

This could be accomplished to some extent by means of product term sharing in product term sharing array 38, or by duplicating within AND array 30 the logic operation that produces the clock signal. However, these methods of clock signal sharing are inefficient and may result in clock signal skew among some of the macrocells 36.

Alternatively, a single product term clock signal may be produced by AND array 30 and routed to all macrocells in the generic logic block, to the exclusion of all other product term clock signals. However, this method of clock signal sharing is inflexible and does not permit some macrocells to use individualized product term clock signals.

To solve this problem, a universal product term output 40 from AND array 30 is provided to each macrocell 36. Universal product term output 40 is independent of the other product term outputs provided to macrocells 36. Referring to FIG. 4, universal product term output 40 is provided to clock enable multiplexer 60 and clock signal multiplexer 64 of each macrocell 36. If one of these multiplexers is programmed to select universal product term output 40, then universal product term output 40 may be used as either the clock enable signal or the clock signal for register 58 in the macrocell 36.

Alternatively, clock enable multiplexer 60 or clock signal multiplexer 64 for any given macrocell 36 may be programmed to utilize product term output 32b as a product term clock signal or clock enable signal for that macrocell. Thus, each macrocell 36 may utilize either an individualized product term clock signal (product term output 32b) or a universal product term clock signal (universal product term output 40). This is an improvement over previous programmable logic devices, in which the choice between a universal product term clock signal and an individualized product term clock signal was not available.

In an alternative embodiment, universal product term output 40 may be routed to other destinations within generic logic block 26, such as the preset or reset inputs of the macrocell registers 58. This provides a means to preset or reset some or all registers 58 in generic logic block 26 according to universal product term output 40.

In another alternative embodiment, more than one universal product term output 40 may be produced by AND array 30. These universal product term outputs 40 may be routed to the clock, clock enable, preset or reset inputs of the macrocell registers 58, or to other destinations within generic logic block 26.

Although the present invention and its advantages have been described in detail, it should be understood that various changes, substitutions, and alterations can be made therein without departing from the spirit and scope of the invention as defined by the appended claims.

We claim:

1. A programmable logic device comprising:

a programmable logic array having a plurality of outputs;

a register data multiplexer having a first input terminal coupled to a routing pool line and a second input terminal coupled to at least one of the outputs of the programmable logic array, the register data multiplexer being operable to select an input signal source from a group including the routing pool line and the at least one output of the programmable logic array, and operable to generate an output signal at an output terminal in response to the input signal source;

a register having a data input terminal coupled to the output terminal of the register data multiplexer, the register further having a data output terminal, the register being operable to receive and store the output signal of the register data multiplexer;

a first output multiplexer having a first input terminal coupled to the data input terminal of the register, the first output multiplexer having a second input terminal coupled to the data output terminal of the register; and a second output multiplexer having a first input terminal coupled to the data input terminal of the register, the second output multiplexer having a second input terminal coupled to the data output terminal of the register;

wherein the first output multiplexer further comprises an output terminal coupled to a feedback line, the feedback line being coupled to an input terminal of the programmable logic array.

2. A programmable logic device comprising:

a programmable logic array having a plurality of outputs;

a register data multiplexer having a first input terminal coupled to a routing pool line and a second input terminal coupled to at least one of the outputs of the programmable logic array, the register data multiplexer being operable to select an input signal source from a group including the routing pool line and the at least one output of the programmable logic array, and operable to generate an output signal at an output terminal in response to the input signal source;

a register having a data input terminal coupled to the output terminal of the register data multiplexer, the register further having a data output terminal, the register being operable to receive and store the output signal of the register data multiplexer;

a first output multiplexer having a first input terminal coupled to the data input terminal of the register, the first output multiplexer having a second input terminal coupled to the data output terminal of the register; and a second output multiplexer having a first input terminal coupled to the data input terminal of the register, the second output multiplexer having a second input terminal coupled to the data output terminal of the register;

wherein the second output multiplexer further comprises an output terminal coupled to an output routing system.

3. A programmable logic device comprising:

a programmable logic array having a plurality of outputs;

a register data multiplexer having a first input terminal coupled to a routing pool line and a second input terminal coupled to at least one of the outputs of the programmable logic array, the register data multiplexer being operable to select an input signal source from a group including the routing pool line and the at least one output of the programmable logic array, and operable to generate an output signal at an output terminal in response to the input signal source;

a register having a data input terminal coupled to the output terminal of the register data multiplexer, the register further having a data output terminal, the register being operable to receive and store the output signal of the register data multiplexer;

a first output multiplexer having a first input terminal coupled to the data input terminal of the register, the first output multiplexer having a second input terminal coupled to the data output terminal of the register; and a second output multiplexer having a first input terminal coupled to the data input terminal of the register, the second output multiplexer having a second input terminal coupled to the data output terminal of the register;

wherein the first output multiplexer further comprises a select terminal coupled to a programmable cell, the first output multiplexer being operable to generate an output signal selected from a group including a data input signal of the register and a data output signal of the register, the output signal being selected in response to a select signal received from the programmable cell.

4. A programmable logic device comprising:

a programmable logic array having a plurality of outputs;

a register data multiplexer having a first input terminal coupled to a routing pool line and a second input terminal coupled to at least one of the outputs of the programmable logic array, the register data multiplexer being operable to select an input signal source from a group including the routing pool line and the at least one output of the programmable logic array, and operable to generate an output signal at an output terminal in response to the input signal source;

a register having a data input terminal coupled to the output terminal of the register data multiplexer, the register further having a data output terminal, the register being operable to receive and store the output signal of the register data multiplexer;

a first output multiplexer having a first input terminal coupled to the data input terminal of the register, the first output multiplexer having a second input terminal coupled to the data output terminal of the register; and a second output multiplexer having a first input terminal coupled to the data input terminal of the register, the second output multiplexer having a second input terminal coupled to the data output terminal of the register;

wherein the second output multiplexer further comprises a select terminal coupled to a programmable cell, the second output multiplexer being operable to generate an output signal selected from a group including a data input signal of the register and a data output signal of the register, the output signal being selected in response to a select signal received from the programmable cell.

5. A programmable logic device comprising:

a plurality of I/O cells;

a plurality of logic blocks; and a programmable routing pool operable to provide connections among the logic blocks and the I/O cells;

wherein at least one of the logic blocks includes:

a programmable logic array having a plurality of outputs;

a first logic circuit connected to received at least one of the programmable logic array outputs, the first logic circuit being operable to generate an output signal in response to at least one of the programmable logic array outputs;

a second logic circuit connected to received at least one of the programmable logic array outputs, the second logic circuit being operable to generate an output signal in response to at least one of the programmable logic array outputs;

a register data multiplexer having a first input terminal coupled to a routing pool line of the programmable routing pool, a second input terminal connected to receive the output signal of the first logic circuit and a third input terminal connected to receive the output signal of the second logic circuit, the register data multiplexer being operable to select an input signal source from a group including the routing pool line and the output signals of the first and second logic circuits, and operable to generate an output signal at an output terminal in response to the input signal source;

a register having a data input terminal coupled to the output terminal of the register data multiplexer, the register further having a data output terminal, the register being operable to receive and store the output signal of the register data multiplexer;

a first output multiplexer having a plurality of input terminals connected to a corresponding plurality of the data input terminals of the register data multiplexer, the first output multiplexer having a register data input terminal coupled to the data output terminal of the register; and a second output multiplexer having a plurality of input terminals connected to a corresponding plurality of the data input terminals of the register data multiplexer, the second output multiplexer having a register data input terminal coupled to the data output terminal of the register.

6. The programmable logic device of claim 5, wherein the first output multiplexer of at least one of the logic blocks further comprises an output terminal coupled to a feedback line, the feedback line being coupled to an input terminal of the programmable logic array.

7. The programmable logic device of claim 5, wherein the second output multiplexer of at least one of the logic blocks further comprises an output terminal coupled to the programmable routing pool.

8. The programmable logic device of claim 5, wherein the first output multiplexer of at least one of the logic blocks further comprises a select terminal coupled to a programmable cell, the first output multiplexer being operable to generate an output signal selected from a group including a data input signal of the register and a data output signal of the register, the output signal being selected in response to a select signal received from the programmable cell.

9. The programmable logic device of claim 5, wherein the second output multiplexer of at least one of the logic blocks further comprises a select terminal coupled to a programmable cell, the first output multiplexer being operable to generate an output signal selected from a group including a data input signal of the register and a data output signal of the register, the output signal being selected in response to a select signal received from the programmable cell.

10. A programmable logic device comprising:

a programmable logic array having a plurality of outputs;

a register coupled to at least one of the outputs of the programmable logic array, the register having a reset input and a preset input; and a programmable switching device having an input terminal coupled to receive a reset signal, the programmable switching device having a first output terminal coupled to the reset input of the register, the programmable switching device having a second output terminal coupled to the preset input of the register, the programmable switching device being operable to programmably route the reset signal to a selected one of the reset input and the preset input of the register.

11. The programmable logic device of claim 10, wherein the programmable switching device comprises a demultiplexer having an input terminal operable to receive the reset signal, and having a first output terminal coupled to the reset input of the register, and having a second output terminal coupled to the preset input of the register, and having a select terminal coupled to a programmable cell, the demultiplexer being operable to route the reset signal to a selected one of the reset input and the preset input of the register in response to a select signal received from the programmable cell.

12. The programmable logic device of claim 10, further comprising an OR gate having a plurality of input terminals, at least one of the input terminals being coupled to one of the outputs of the programmable logic array, the OR gate further having an output terminal coupled to a data input of the register.

13. The programmable logic device of claim 10, further comprising an OR gate having an output terminal coupled to the reset input of the register, the OR gate having a first input terminal coupled to the programmable switching device and a second input terminal coupled to a second reset signal source, the OR gate being operable to provide a reset signal to the register in response to either one of the reset signal and a second reset signal from the second reset signal source.

14. The programmable logic device of claim 10, further comprising an OR gate having an output terminal coupled to the preset input of the register, the OR gate having a first input terminal coupled to the programmable switching device and a second input terminal coupled to a preset signal source, the OR gate being operable to provide a preset signal to the register in response to either one of the reset signal and a preset signal from the preset signal source.

15. A programmable logic device comprising:
a plurality of logic blocks, each logic block having:
a programmable logic array having a plurality of outputs;
a register coupled to at least one of the outputs of the programmable logic array, the register having a reset input and a preset input; and
a programmable switching device having an input terminal coupled to receive a reset signal, the programmable switching device having a first output terminal coupled to the reset input of the register, the programmable switching device having a second output terminal coupled to the preset input of the register, the programmable switching device being operable to programmably route the reset signal to a selected one of the reset input and the preset input of the register;
a plurality of I/O cells; and
a programmable routing pool operable to provide connections among the logic blocks and the I/O cells.

16. The programmable logic device of claim 15, wherein the programmable switching device of at least one of the logic blocks comprises a demultiplexer having an input terminal operable to receive the reset signal, and having a first output terminal coupled to the reset input of the register, and having a second output terminal coupled to the preset input of the register, and having a select terminal coupled to a programmable cell, the demultiplexer being operable to route the reset signal to a selected one of the reset input and the preset input of the register in response to a select signal received from the programmable cell.

17. The programmable logic device of claim 15, wherein at least one of the logic blocks further comprises an OR gate having a plurality of input terminals, at least one of the input terminals being coupled to one of the outputs of the programmable logic array, the OR gate further having an output terminal coupled to a data input of the register.

18. The programmable logic device of claim 15, wherein at least one of the logic blocks further comprises an OR gate having an output terminal coupled to the reset input of the register, the OR gate having a first input terminal coupled to the programmable switching device and a second input terminal coupled to a second reset signal source, the OR gate being operable to provide a reset signal to the register in response to either one of the reset signal and a second reset signal from the second reset signal source.

19. The programmable logic device of claim 15, wherein at least one of the logic blocks further comprises an OR gate having an output terminal coupled to the preset input of the register, the OR gate having a first input terminal coupled to the programmable switching device and a second input terminal coupled to a preset signal source, the OR gate being operable to provide a preset signal to the register in response to either one of the reset signal and a preset signal from the preset signal source.

20. A method for programmably resetting a register in a logic block of a programmable logic device, comprising:
receiving a reset signal at a programmable switching device in the logic block;
receiving a select signal at the programmable switching device from a programmable cell; and
providing the reset signal to a destination selected from a group including a reset input of the register and a preset input of the register by the programmable switching device in response to the select signal.

21. The method of claim 20, further comprising:
providing an OR gate coupled to the programmable switching device and coupled to a second reset signal source; and
providing a reset signal to the reset input of the register by the OR gate in response to either one of the reset signal and a second reset signal from the second reset signal source.

22. The method of claim 20, further comprising:
providing an OR gate coupled to the programmable switching device and coupled to a preset signal source; and
providing a preset signal to the preset input of the register by the OR gate in response to either one of the reset signal and a preset signal from the second reset signal source.

23. A programmable logic device comprising:
a programmable logic array having a plurality of outputs;
a product term sharing array having a plurality of bus lines, each bus line being coupled to at least one of the outputs of the programmable logic array, the product term sharing array further having a plurality of output lines, each output line being coupled to a plurality of programmable interconnections, each programmable interconnection being operable to provide a connection between the output line and one of the bus lines, wherein each output line of the product term sharing array is coupled to a preselected number of programmable interconnections, the preselected number being less than the number of bus lines; and
an output processing system coupled to the output lines of the product term sharing array, the output processing system being operable to receive and process output signals from the product term sharing array.

24. The programmable logic device of claim 23, further comprising a plurality of OR gates, each OR gate having a plurality of input terminals, each input terminal being coupled to an output of the programmable logic array, each OR gate further having an output terminal coupled to one of the bus lines of the product term sharing array.

25. The programmable logic device of claim 23, further comprising a plurality of I/O cells operable to receive processed output signals from the output processing system, and operable to provide the processed output signals to a plurality of I/O pins.

26. The programmable logic device of claim 23, wherein the output processing system comprises:

a register having a data input coupled to at least one of the output lines of the product term sharing array, the register further having a data output, the register being operable to store a data signal received on the at least one output line of the product term sharing array; and an output multiplexer having a first input terminal coupled to a selected one of the output lines of the product term sharing array, the output multiplexer further having a second input terminal coupled to the data output of the register, the output multiplexer further having a select input terminal and an output terminal, the output multiplexer being operable to provide an output signal at the output terminal, the output signal being selected from a group including the data output of the register and the selected one of the output lines of the product term sharing array.

27. The programmable logic device of claim 23, wherein the programmable logic array comprises an array of AND gates.

28. The programmable logic device of claim 24, wherein the product term sharing array further comprises a plurality of OR gates, each OR gate having at least one input terminal coupled to at least one of the programmable interconnections, each OR gate further having an output terminal coupled to a corresponding one of the output lines of the product term sharing array.

29. A programmable logic device comprising:

a plurality of I/O cells;

a plurality of logic blocks, each logic block having:

a programmable logic array having a plurality of outputs;

a product term sharing array having a plurality of bus lines, each bus line being coupled to at least one of the outputs of the programmable logic array, the product term sharing array further having a plurality of output lines, each output line being coupled to a plurality of programmable interconnections, each programmable interconnection being operable to provide a connection between the output line and one of the bus lines, wherein each output line of the product term sharing array is coupled to a preselected number of programmable interconnections, the preselected number being less than the number of bus lines; and an output processing system coupled to the output lines of the product term sharing array, the output processing system being operable to receive and process output signals from the product term sharing array; and a programmable routing pool operable to provide connections among the logic blocks and the I/O cells.

30. The programmable logic device of claim 29, wherein at least one of the logic blocks further comprises a plurality of OR gates, each OR gate having a plurality of input terminals, each input terminal being coupled to an output of the programmable logic array, each OR gate further having an output terminal coupled to one of the bus lines of the product term sharing array.

31. The programmable logic device of claim 29, wherein the I/O cells are operable to receive processed output signals from the output processing system, and operable to provide the processed output signals to a plurality of I/O pins.

32. The programmable logic device of claim 29, wherein the output processing system of at least one of the logic blocks comprises:

a register having a data input coupled to at least one of the output lines of the product term sharing array, the register further having a data output, the register being operable to store a data signal received one the at least one output line of the product term sharing array; and an output multiplexer having a first input terminal coupled to a selected one of the output lines of the product term sharing array, the output multiplexer further having a second input terminal coupled to the data output of the register, the output multiplexer further having a select input terminal and an output terminal, the output multiplexer being operable to provide an output signal at the output terminal, the output signal being selected from a group including the data output of the register and the selected one of the output lines of the product term sharing array.

33. The programmable logic device of claim 29, wherein the programmable logic array of at least one of the logic blocks comprises an array of AND gates.

34. The programmable logic device of claim 29, wherein the product term sharing array of at least one of the logic blocks further comprises a plurality of OR gates, each OR gate having at least one input terminal coupled to at least one of the programmable interconnections, each OR gate further having an output terminal coupled to a corresponding one of the output lines of the product term sharing array.

35. A programmable logic device comprising:

a programmable logic array having a universal output and a plurality of individual outputs;

a plurality of registers, each register having a data input, a data output and a clock input, the data input of at least one of the registers being coupled to at least one of the individual outputs of the programmable logic array, the clock input of each register being coupled to the universal output of the programmable logic array; and a routing pool coupled to the data output of each register, the routing pool being operable to programmably route data output signals from the registers.

36. A programmable logic device comprising:

a plurality of logic blocks, each logic block having:

a programmable logic array having a universal output and a plurality of individual outputs; and a plurality of registers, each register having a data input, a data output and a clock input, the data input of at least one of the registers being coupled to at least one of the individual outputs of the programmable logic array, the clock input of each register being coupled to the universal output of the programmable logic array;

a plurality of I/O cells; and a programmable routing pool coupled to the data outputs of the registers and operable to provide connections among the logic blocks and the I/O cells.

37. A programmable logic device comprising:

a plurality of I/O cells;

a plurality of logic block clusters, each logic block cluster having a plurality of logic blocks and a cluster routing pool operable to provide programmable connections among the logic blocks and selected ones of the I/O cells, each logic block having:

a programmable logic array having a plurality of outputs;

a product term sharing array having a plurality of bus lines, each bus line being coupled to at least one of the outputs of the programmable logic array, the product term sharing array further having a plurality of output lines, each output line being coupled to a plurality of programmable interconnections, each programmable interconnection being operable to provide a connection to one of the bus lines, wherein each output line of the product term sharing array is coupled to the same number of programmable interconnections;

a register coupled to at least one of the output lines of the product term sharing array, the register having a data input terminal and a data output terminal;

a first output multiplexer having a first input terminal coupled to the data input terminal of the register, the first output multiplexer having a second input terminal coupled to the data output terminal of the register; and a second output multiplexer having a first input terminal coupled to the data input terminal of the register, the second output multiplexer having a second input terminal coupled to the data output terminal of the register; and a global routing pool operable to provide programmable connections among the logic block clusters and the I/O cells.

38. A programmable logic device, comprising:

a programmable logic array, said programmable logic array providing a plurality of logic signals at a plurality of output terminals positioned generally along the extent of a line segment; and a programmable signal steering circuit having a plurality of output terminals, coupled to receive said logic signals from said plurality of output terminals of said programmable logic array, said programmable interconnect circuit allowing each of said logic signals to be coupled to an equal number of said output terminals of said programmable interconnect circuit.

39. A programmable logic device as in claim 38, wherein said programmable logic array comprises an AND array.

40. A programmable logic device as in claim 39, wherein said AND array providing a plurality of product term signals, said programmable logic array further comprises a plurality of OR logic gates, each of said OR logic gates receiving a predetermined number of said product term signals and providing as output one of said output signals of said programmable logic array.

41. A programmable logic device as in claim 38, wherein said programmable logic array further comprises a second set of output terminals each receiving said logic signals, each of said second set of output terminals being coupled to a clock terminal of a state element.

42. A programmable logic device as in claim 38, wherein said programmable logic array further comprises a second set of output terminals each receiving said logic signals, each of said second set of output terminals being coupled to a reset terminal of a state element.

43. A programmable logic device as in claim 38, wherein said programmable logic array further comprises a second set of output terminals each receiving said logic signals, each of said second set of output terminals being coupled to a preset terminal of a state element.

44. A programmable logic device as in claim 38, wherein said programmable logic array further comprises a second set of output terminals each receiving said logic signals, each of said second set of output terminals being coupled to a control terminal of an output buffer.

45. A programmable logic device as in claim 38 wherein said programmable signal steering circuit couples each logic signal to a group of output terminals of said programmable signal steering circuit bearing a predetermined positional relationship to each other, except at a selected group of output terminals of said programmable signal steering array at opposite ends of said line segment; said programmable signal steering circuit couples logic signals to said output terminals of said selected group as if output terminals in said selected group bears said predetermined positional relationship each other.

46. A programmable logic device, comprising:

a programmable logic array providing as output a plurality of logic signals; and first and second programmable logic circuits each including a terminal for receiving a common control signal and a plurality of elements each having a control input terminal, each programmable logic circuit being programmable to select for each of said control input terminal either one of said logic signals or said common control signal.

47. A programmable logic device as in claim 46, wherein said control input terminal receives a clock signal.

48. A programmable logic device as in claim 47, wherein said control input terminal receives a reset signal.

49. A programmable logic device as in claim 46, wherein said control input terminal receives a output enable signal.

50. A programmable logic device as in claim 47, wherein said control input terminal receives a preset signal.

51. A programmable logic device comprising:

a programmable logic array having a plurality of outputs;

a first logic circuit connected to received at least one of the programmable logic array outputs, the first logic circuit being operable to generate an output signal in response to at least one of the programmable logic array outputs;

a second logic circuit connected to received at least one of the programmable logic array outputs, the second logic circuit being operable to generate an output signal in response to at least one of the programmable logic array outputs;

a register data multiplexer having a first input terminal connected to receive the output signal of the first logic circuit and a second input terminal connected to receive the output signal of the second logic circuit, the register data multiplexer being operable to select an input signal source from a group including the output signals of the first and second logic circuits, and operable to generate an output signal at an output terminal in response to the input signal source;

a register having a data input terminal coupled to the output terminal of the register data multiplexer, the register further having a data output terminal, the register being operable to receive and store the output signal of the register data multiplexer;

a first output multiplexer having a first input terminal connected to receive the output signal of the first logic circuit, the first output multiplexer having a second input terminal connected to receive the output signal of the second logic circuit, the first output multiplexer having a third input terminal coupled to the data output terminal of the register; and a second output multiplexer having a first input terminal connected to receive the output signal of the first logic circuit, the second output multiplexer having a second input terminal connected to receive the output signal of the second logic circuit, the second output multiplexer having a third input terminal coupled to the data output terminal of the register.

* * * * *

UNITED STATES PATENT AND TRADEMARK OFFICE
CERTIFICATE OF CORRECTION

PATENT NO.   : 6,104,207
DATED        : August 15, 2000
INVENTOR(S)  : Chan et al.

Figure 3A:
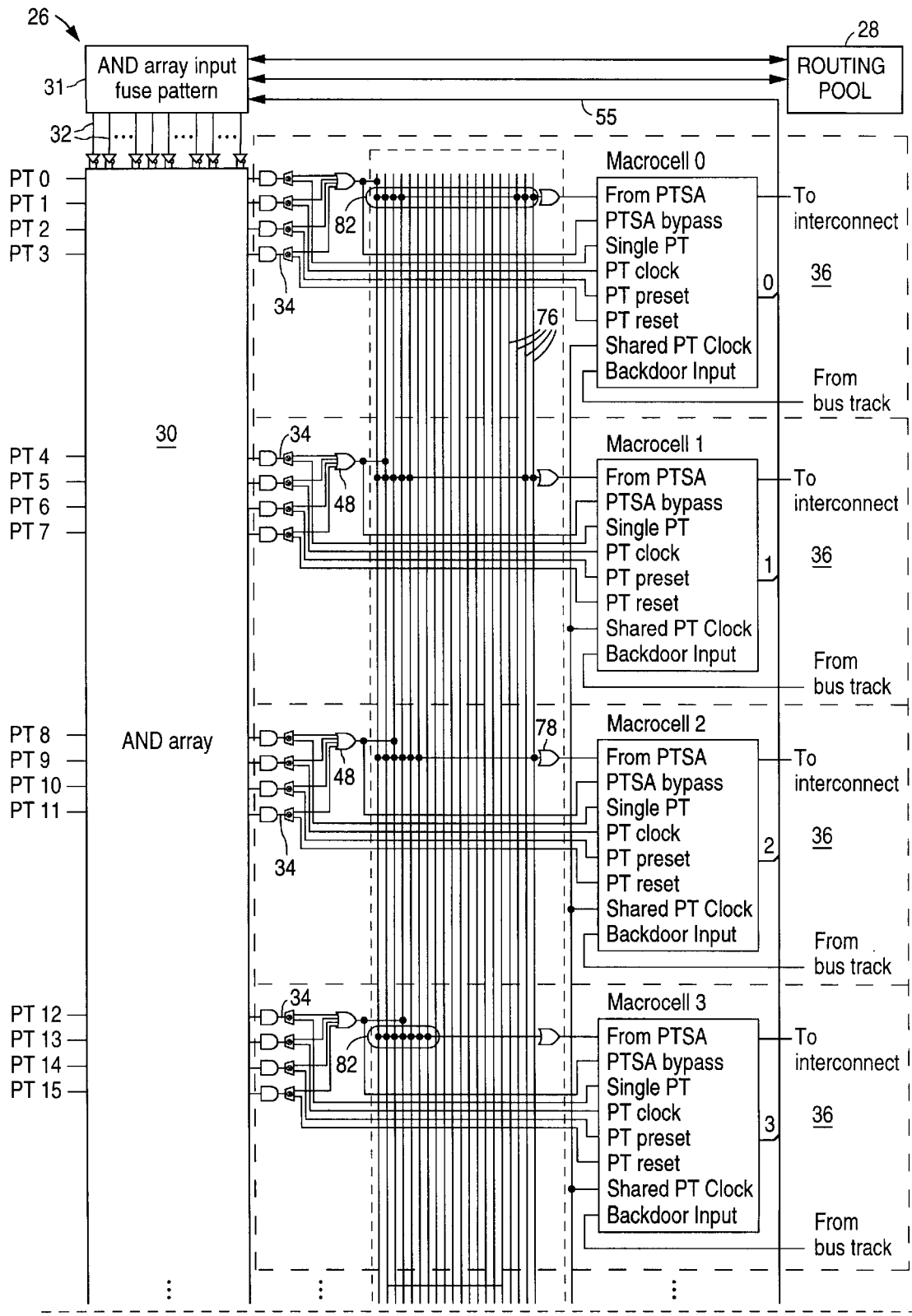
FIG. 3 is a schematic diagram in partial block form of an exemplary generic logic block in the programmable logic device.
Figure 3B:
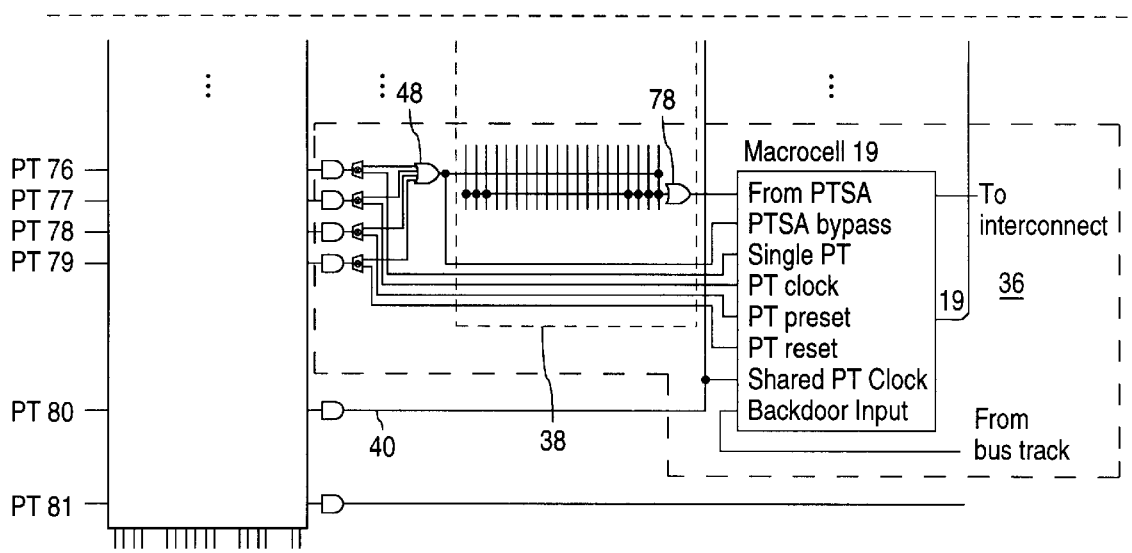

It is certified that error appears in the above-identified patent and that said Letters Patent is hereby corrected as shown below:

<u>Title page,</u>
Item [75], Inventors, after "Cyrus Y. Tsui, Los Altos" insert -- Hills --;

<u>Column 2,</u>
Line 23, after "FIG. 3" insert -- (comprising FIGS. 3A and 3B) --;
Line 67, delete the equation "X = A⊕B⊕C ⊕ A⊕B⊕D ⊕ D⊕E" and insert
-- X = A⊗B⊗C ⊕ A⊗B⊗D ⊕ D⊗E --;

<u>Column 3,</u>
Line 4, delete "⊕" and insert -- ⊗ --;
Line 5, delete "A⊕B⊕C" and insert -- A⊗B⊗C --; and
Line 16, after "FIG. 3" insert -- (comprising FIGS. 3A and 3B) --.

Signed and Sealed this

Third Day of June, 2003

JAMES E. ROGAN
*Director of the United States Patent and Trademark Office*